United States Patent [19]

Darling, Jr.

[11] Patent Number: 5,393,557
[45] Date of Patent: Feb. 28, 1995

[54] METHOD FOR MEASURING ELECTROMAGNETIC PROPERTIES

[75] Inventor: Phillip H. Darling, Jr., Buena Park, Calif.

[73] Assignee: Northrop Grumman Corporation, Los Angeles, Calif.

[21] Appl. No.: 992,238

[22] Filed: Dec. 17, 1992

[51] Int. Cl.6 ............................................. C23C 16/00
[52] U.S. Cl. ................................. 427/10; 427/248.1; 427/553; 427/595
[58] Field of Search ..................... 427/8, 10, 553, 595, 427/248.1

[56] References Cited

U.S. PATENT DOCUMENTS

| | | | |
|---|---|---|---|
| 2,940,040 | 6/1960 | Rosenthal | 324/71 |
| 3,818,335 | 6/1974 | Stungis et al. | 324/65 R |
| 4,408,156 | 10/1983 | Veys | 324/58.5 R |
| 4,500,835 | 2/1985 | Heikkila | 324/58.5 A |
| 4,607,212 | 8/1986 | Jakkula | 324/58.5 R |
| 5,141,595 | 8/1992 | Darling, Jr. | 156/610 |

Primary Examiner—Bernard Pianalto
Attorney, Agent, or Firm—Terry J. Anderson; Karl J. Hoch

[57] ABSTRACT

A system and method is provided for measuring the electrical resistivity of a member without physically contacting the member. The system includes an electromagnetic energy transceiver having a transmitting and receiving antenna. The antenna is positioned in close proximity to the member being tested. Electromagnetic energy, such as microwave energy, is transmitted by the transceiver at the member being tested. Reflected electromagnetic energy is received at the antenna that has been reflected by the member hack to the antenna. The transceiver then generates an output that is proportional to the reflected electromagnetic energy and, thus, is proportional to the non-reflected electromagnetic energy absorbed by the member being tested. The output signal can thus be used to indicate resistivity of the member to electrical transmission. The output signal can be connected to a drive or controller of a high temperature coating system to increase or decrease electrical resistivity of the member while it is being manufactured to thereby control or maintain a predetermined electrical resistivity of the member at a desired quality.

39 Claims, 1 Drawing Sheet

METHOD FOR MEASURING ELECTROMAGNETIC PROPERTIES

BACKGROUND OF THE INVENTION

1. Field of the Invention

The present invention relates to a system and method for measuring electromagnetic properties of a member and, more particularly, to a system and method that does not physically contact the member being tested.

2. Prior Art

U.S. Pat. No. 5,141,595 (Darling, Jr.) discloses a method and apparatus for coating of refractory substrates with a highly uniform layer of graphite or other material. Electrical pick-ups are used with an electronic control and transport motor for physically altering substrate transport velocity, or other parameters, to adjust the coated substrate's properties. U.S. Pat. No. 4,408,156 (Veys) discloses the use of microwave radiation to detect thin conductive fibers placed on a sheet article of nonconductive material for identification purposes. The system computes the difference between transmitted, and reflected radiation. U.S. Pat. Nos. 4,500,835 (Heikkila) and 4,607,212 (Jakkula) disclose the use of microwave radiation for detecting grain direction and knots in lumber. U.S. Pat. No. 3,818,335 (Stungis et al.) discloses use of probes to monitor and detect the applied amounts of conductive material on a moving non-conductive web, after moving. U.S. Pat. No. 2,940,040 (Rosenthal) discloses the measurement of direct current resistivity of plastic materials for quality control purposes.

SUMMARY OF THE INVENTION

In accordance with one method of the present invention, a method for controlling a conductive member manufacturing apparatus is provided comprising steps of transmitting electromagnetic energy from an antenna of a transceiver to an area of the member, the member being in substantially close proximity to the antenna; receiving reflective electromagnetic energy at the antenna that has been reflected by the member back to the antenna; and transmitting a signal from the transceiver to a control of the apparatus to increase or decrease a predetermined process that influences resistivity of the member based upon received reflected electromagnetic energy thereby controlling resistivity of the member while it is being manufactured.

In accordance with another method of the present invention, the method of controlling applications of a high temperature coating to a sheet material is provided comprising steps of providing a coating system adapted to apply the high temperature coating to the sheet material, the system having a drive adapted to move the sheet material as the coating is being applied; transmitting electromagnetic energy from an antenna of a transceiver to a portion of the sheet material having been coated by the high temperature coating; receiving reflected electromagnetic energy at the antenna that has been reflected by the portion back to the antenna; and changing the speed of the drive based upon an amount of received reflected electromagnetic energy such that application of the high temperature coating to the sheet material can be increased or decreased along a length of the sheet material to maintain a predetermined quality control.

In accordance with another method of the present invention, a method of testing magnetic susceptibility of a nonconductive member is provided comprising steps of positioning a transceiver proximate an area of the nonconductive member to be tested, the transceiver having an antenna, means for transmitting electromagnetic energy, means for receiving electromagnetic energy, and means for generating an output signal based upon received electromagnetic energy; transmitting electromagnetic energy from the antenna to the areas receiving reflected electromagnetic energy at the antenna that has been reflected by the member back to the antenna; generating an output signal from the transceiver corresponding to the amount of reflected electromagnetic energy received by the antenna; and determining absorption of the transmitted electromagnetic energy by the non-conductive member based upon received reflected electromagnetic energy and the size of the area being tested.

BRIEF DESCRIPTION OF THE DRAWINGS

The foregoing aspects and other features of the invention are explained in the following description, taken in connection with the accompanying drawings, wherein.

DETAILED DESCRIPTION OF THE INVENTION

Figure 1:
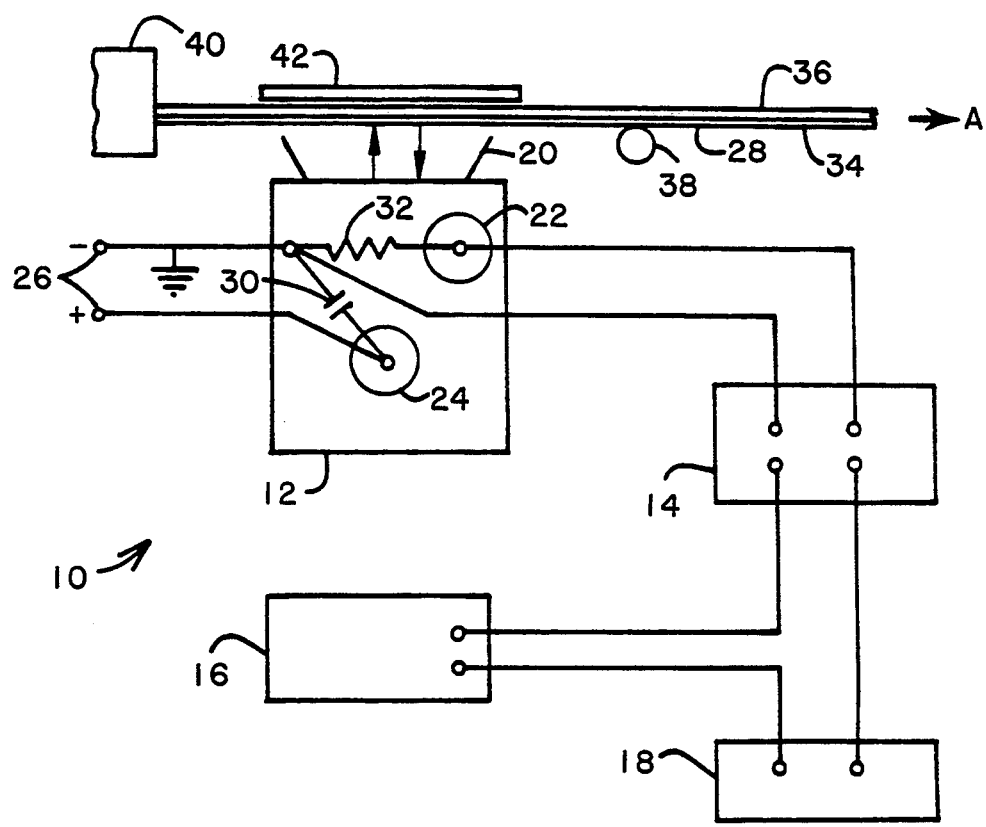
FIG. 1 is a schematic diagram of a system incorporating features of the present invention.

FIG. 1 is a schematic diagram of a system 10 used to measure electrical resistivity of a member incorporating features of the present invention. Although the present invention will be described with reference to the single embodiment shown in the drawings, it should be understood that the present invention can be embodied in various different forms of embodiment. In addition, any suitable size, shape or type of members, elements or materials could be used as further understood below.

Figure 2:
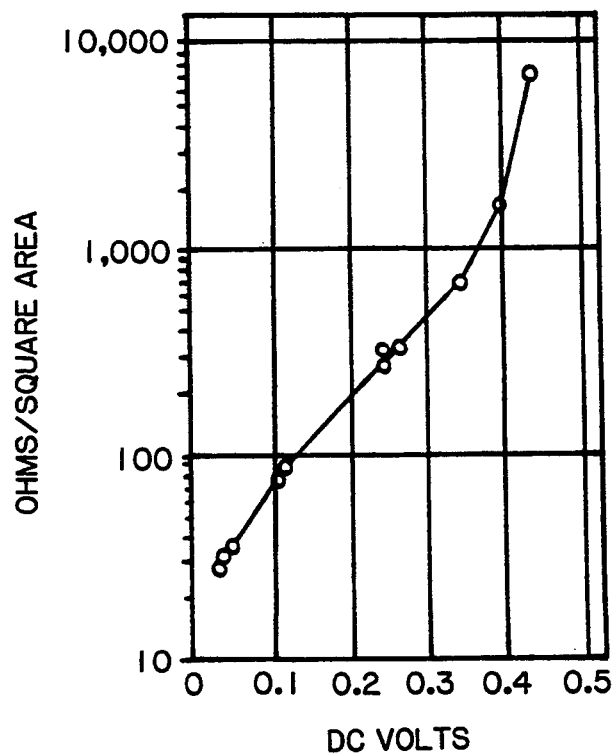
FIG. 2 is a graph of sample test results of the system shown in FIG. 1.

The system 10 generally comprises a transceiver 12, a linearizing amplifier 14, a readout 16, and a controller 18. The transceiver 12 generally comprises an antenna 20, a mixer 22, and an oscillator 24. In a preferred embodiment, the transceiver 12 is an electromagnetic energy transmit and receive unit. The transceiver 12 is preferably a microwave transmit and receive unit such as Type GOS2580 Motion Detector Module manufactured by Alpha Industries, Inc. which can transmit microwave energy at a frequency of about 10.525 GHz. The transceiver 12 operates with an 8 volt DC input at input terminals 26. The antenna 20 is preferably a horn antenna that can both transmit a nearly parallel unguided beam of microwaves at a member 28 and receive microwaves reflected by the member 28 back to the antenna. The waves entering the antenna as reflected energy produce a DC-voltage across the load resistance. This voltage is representative of the energy reflected. The mixer 22 is preferably a schottky barrier diode and the oscillator 24 is preferably a Gunn diode that acts as an emitter and local oscillator. The transceiver is supplied with a capacitor 30 fitted between the Gunn bias terminal and ground to suppress bias circuit oscillations. The mixer output terminal is fitted with a load resistor 32, such as a 12K resistor. The DC voltage component of the mixer, output to amplifier 14 for the preferred embodiment described above, is shown in FIG. 2. The output is proportional to the electrical resistance of the member 28 at the antenna 20. The output generally ranges from about 0.050 mv DC to about 450 mv DC FIG. 2 shows the output of the transceiver 12, measured in DC volts, plotted relative to the resistivity of the area of member 28 at the antenna 20 as further understood below. In actuality, the area used in the resistivity calculation is the volume of the member 28 at the antenna 20, but is described herein as the simplified term of area due to the relatively thin thickness of the member 28. In order to insure accurate and uniform measurements of reflected microwave energy, the system 10 includes a backing plate 42 located opposite the antenna 20. The backing plate 42 is provided to insure that the member 28 is in a restrained plane at the area of the antenna 20 while being tested. However, any suitable type of plane restraining system could be provided. In addition, the backing plate also provides the function of at least partially constraining the member 28 at a predetermined spacing from the antenna 20. However, any suitable type of spacing system could be provided.

The DC voltage component of the mixer output is sent to the linearizing amplifier 14. In a preferred embodiment, a linearizing DC transmitter, such as AP4155 manufactured by Action Instruments Inc. of San Diego, Calif., is used. The linearizing amplifier 14 has an input amplifier, in series of twelve gain stages, and an output amplifier. The DC signal is fed to the input amplifier which drives the series of twelve gain stages. The gain stages are activated in turn at DC input levels predetermined at the factory for best 12-segment linearization; the segments are more closely grouped at most non-linear portions of the input curve. Each stage adds to or subtracts from the gain of the preceding stage as necessary to correct the input non-linearity. The linearization stage allows adjustment of zero, and drives an output buffer stage which allows adjustment of span. The amplifier 14 produces a current output (e.g. 4–20 mA) that is a constant-current source controlled by the buffer stage. For a DC input of 49 mv to 450 mv, the output is preferably between about 4 mA to about 20 mA.

The current output from the linearizing amplifier 14 is directed to the readout 16 and the drive control 18. The readout 16 is preferably a digital readout, such as the VISIPAK V500 line of digital process indicators manufactured by Action Instruments, Inc. of San Diego, Calif., to display a readout in ohms per square area at antenna 20. The controller 18 is part of a coating system adapted to apply a high temperature coating 34 to a sheet material 36 that constitutes the member 28. Any suitable drive, such as including drive rollers 38, can be used to help move the member 28 in the direction illustrated by arrow A out of the coating applicator 40. The controller 18 is adapted to control the speed of the drive and thereby control the amount of coating being applied to a length of the sheet material 36.

In a preferred method of the present invention, the sheet material or substrate 36 is made of a woven-type yarn, such as NEXTEL 312 fiber having 62% aluminum oxide ($Al_2O_3$), 14% boron oxide ($B_2O_3$), and 24% silicon dioxide ($SiO_2$) by weight. The fibers are woven into a fabric of 300 denier, 5 harness satin weave, 60×60 yarns/inch. Of course, any suitable substrate could be used. The coating applicator 40 is substantially the same as the system described in U.S. Pat. No. 5,141,595 which is hereby incorporated by reference. The system 40 is used to apply the electrically conductive superstrate or graphite coating 34 to the substrate 36. The faster the speed of the substrate 36 through the system 40, the thinner the layer of superstrate 34. The thinner the layer of superstrate 34, the higher the resistivity of the member 28. Thus, the faster the speed of the substrate 36 through the system 40, the higher the resistivity of the member 28. Conversely, the slower the speed of the substrate 36 through the system 40, the thicker the layer of superstrate 34 and the lower the resistivity of the member 28. The controller 18, by controlling the speed of the substrate 36 through the system 40, can control the final resistivity of the member 28. Of course, in an alternate embodiment of the present invention, rather than the controller 18 being connected to the drive, the controller 18 could be connected to a valve that regulates precursor gas flow, a thermostat that regulates oven temperature, or a combination of these parameters.

The value of a given property of the coated substrate depends upon the physico-chemical make-up of the superstrate coating. Altering the conditions within the chemical vapor deposition zone by adjusting a parameter, such as substrate transport velocity, flow rate or oven temperature, results in a modification of the properties of the coated substrate. Thus, the described feedback mechanism provides a means for maintaining the value of superstrate properties within desirable tolerances.

At initial start of manufacture of the member 28, the speed of the substrate drive is set at a predetermined value. The system 10 will operate during this initial start, however, the controller 18 is preferably programmed to ignore signals from the system 10 until the resistivity measurements reach a predetermined range of resistivity measurements. Preferably, the drive also has a manual control that can be adjusted by an operator viewing readout 16 to bring the speed up or down until the predetermined range is met. When the predetermined range is met, the controller 18 can then automatically take control of the substrate drive to continuously monitor, and increase or decrease the speed of the substrate 36 through the system 40 to maintain the value of superstrate properties within preprogrammed desirable tolerances. The system 10 may also include a suitable marker to mark the member 28 at the point where it reaches desirable tolerances. Thus, the leading portion of the member 28 before the marker's mark can be removed and discarded for quality control purposes. Unlike the electrical pick-ups disclosed in U.S. Pat. No. 5,141,595, the present invention is adapted to test resistivity of the member 28 without physically contacting the member 28. The system 10 is able to measure resistivity over an area of about 1 to 2 inches at a distance of about ½ inch away from the member 28. Of course, the antenna 20 could be suitably sized, shaped and positioned to provide any suitable testing parameters. This can be important in testing members such as conductive fabric or sheet material because such a relatively large test area can encompass a large enough number of yarns that individual variations and gaps between yarns of the fabric are averaged out. Thus, the measurements are substantially insensitive to yarn variations. The present invention can also be used to test magnetic susceptibility in non-conductive materials. This is due to the fact that the output from the transceiver 12 is also affected by the magnetic susceptibility of a material being tested. Unlike the system described in U.S. Pat. No. 4,408,156, the present invention is much simpler. It merely measures reflected radiation which is then linearized and calibrated in surface resistance units. U.S. Pat. No. 4,408,156 computes the differences among transmitted, absorbed, and reflected energy and needs two sensors located on both sides of the sheet article. In addition, unlike U.S. Pat. No. 4,408,156, the present invention is being used in an active manufacturing quality control system and not merely an identification system. In a preferred embodiment, the microwave radiation from the transceiver is polarized. Conductive fabric yarns that are perpendicular to the electric field E are not significantly detected. This would also be the case for magnetically susceptible yarns relative to the magnetic field H which is perpendicular to the electric field E.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A method of controlling an apparatus adapted for applying a coating to a member comprising the steps of:
   providing a transceiver proximate to a coated region of the member;
   transmitting electromagnetic energy from an antenna of the transceiver to an area of the coated region;
   receiving reflected electromagnetic energy at the antenna that has been reflected by the area of the coated region back to the antenna;
   transmitting a signal, based upon the received reflected electromagnetic energy, from the transceiver to a controller of the apparatus; and,
   controlling a manufacturing process parameter of the apparatus in response to the signal,
   whereby a property of the coated region of the member is maintained within a selected measurement range.

2. A method as in claim 1 wherein the step of transmitting electromagnetic energy comprises transmitting microwave energy.

3. A method as in claim 2 wherein the microwave energy is transmitted at a frequency of about 10.525 GHz.

4. A method as in claim 2 wherein the microwave energy is polarized.

5. A method as in claim 1 wherein the antenna is positioned about one-half inch away from the member.

6. A method as in claim 5 wherein the area is about one to two square inches in size.

7. A method as in claim 1 wherein the manufacturing process parameter is a transport speed of the member through the apparatus.

8. A method as in claim 1 wherein the manufacturing process parameter is a flow rate of a precursor gas into the apparatus.

9. A method as in claim 1 wherein the manufacturing process parameter is an oven temperature of the apparatus.

10. A method as in claim 1 wherein the property is resistivity.

11. A method as in claim 1 wherein the property is magnetic susceptibility.

12. A method as in claim 1 wherein the property is a thickness of the coating.

13. A method as in claim 1 further comprising the step of positioning a backing plate proximate the coated region of the member opposite the antenna.

14. A method of controlling application of a coating to a sheet material comprising the steps of:
   providing a coating system adapted to apply the coating to the sheet material, the system having a drive adapted to move the sheet material as the coating is being applied;
   transmitting electromagnetic energy from an antenna of a transceiver to a portion of the sheet material having been coated by the coating;
   receiving reflected electromagnetic energy at the antenna that has been reflected by the portion back to the antenna; and
   controlling a manufacturing process parameter of the coating system based upon an amount of the received reflected electromagnetic energy such that application of the coating to the sheet material is adapted along a length of the sheet material to maintain a property of the coated sheet material within a selected measurement range.

15. A method as in claim 14 wherein the antenna is positioned proximate a surface of the sheet material with about a one-half inch space between the antenna and the surface.

16. A method as in claim 14 wherein the sheet material is a fabric with woven-type yarns and, the antenna is located above about one to two square inches of area of a surface of the member to thereby provide a suitably large enough number of yarns of the member being located in the area to minimize effect of individual yarn variations and gaps between yarns upon accurate measurement of energy reflection.

17. A method as in claim 16 wherein the fabric is conductive.

18. A method as in claim 16 wherein the fabric is non-conductive.

19. A method as in claim 16 wherein the fabric comprises refractory fibers.

20. A method as in claim 14 wherein the step of transmitting comprises transmitting microwave energy at a frequency of about 10.525 GHz.

21. A method as in claim 14 wherein the electromagnetic energy is polarized.

22. A method as in claim 14 wherein the transceiver generates an output that is then linearized and transmitted to the drive.

23. A method as in claim 14 wherein the manufacturing process parameter is a transport speed of the drive.

24. A method as in claim 14 wherein the manufacturing process parameter is a flow rate of a precursor gas into the coating system.

25. A method as in claim 14 wherein the manufacturing process parameter is an oven temperature of the coating system.

26. A method as in claim 14 wherein the property is resistivity.

27. A method as in claim 14 wherein the property is magnetic susceptibility.

28. A method as in claim 14 wherein the property is a thickness of the coating.

29. A method of testing an electromagnetic property of a member comprising the steps of:
   positioning a transceiver proximate an area of the member to be tested, the transceiver having an antenna, means for transmitting electromagnetic energy, means for receiving electromagnetic energy, and means for generating an output signal based upon received electromagnetic energy;

transmitting electromagnetic energy from the antenna to the area;

receiving reflected electromagnetic energy at the antenna that has been reflected by the member back to the antenna, the reflected electromagnetic energy being representative of the electromagnetic property being tested;

generating an output signal from the transceiver representative of the received reflected electromagnetic energy received by the antenna; and indicating a measurement representative of the output signal on a readout, whereby the electromagnetic property is tested.

30. A method as in claim 29 wherein the electromagnetic property is resistivity.

31. A method as in claim 29 wherein the electromagnetic property is magnetic susceptibility.

32. A method as in claim 29 wherein the member comprises a non-conductive member.

33. A method as in claim 29 wherein the member comprises a refractory member.

34. A method as in claim 29 wherein the member comprises a conductive member.

35. A method as in claim 29 wherein the transmitted electromagnetic energy comprises microwave energy.

36. A method as in claim 35 wherein the transmitted electromagnetic energy has a frequency of about 10.525 GHz.

37. A method as in claim 35 wherein the transmitted electromagnetic energy comprises polarized energy.

38. A method as in claim 35 wherein:
the transceiver is positioned about one-half inch from the member; and,
the area has a size of from about one square inch to about two square inches.

39. A method as in claim 35 further comprising the step of positioning a backing plate proximate a region of the member opposite the antenna.

* * * * *